(12) United States Patent
Saito (10) Patent No.: US 7,746,658 B2
(45) Date of Patent: Jun. 29, 2010

(54) CIRCUIT DEVICE

(75) Inventor: Hidefumi Saito, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/237,650

(22) Filed: Sep. 25, 2008

(65) Prior Publication Data

US 2009/0091899 A1 Apr. 9, 2009

(30) Foreign Application Priority Data

Sep. 26, 2007 (JP) ............................. 2007-249557

(51) Int. Cl.
*H05K 7/00* (2006.01)
(52) U.S. Cl. ....................... 361/760; 361/796
(58) Field of Classification Search ................. 361/760, 361/796
See application file for complete search history.

(56) References Cited

U.S. PATENT DOCUMENTS 6,239,986 B1 * 5/2001 Otsuka ....................... 361/796
6,945,788 B2 * 9/2005 Trout et al. .................... 439/66
2007/0241173 A1 * 10/2007 Turvey et al. ............ 229/117.03

FOREIGN PATENT DOCUMENTS

JP 2007-036014 2/2007

* cited by examiner

*Primary Examiner*—Hung S Bui
*Assistant Examiner*—Andargie M Aychillhum
(74) *Attorney, Agent, or Firm*—Fish & Richardson P.C.

(57) ABSTRACT

The present invention provides a circuit device in which warpage of a case member is prevented. The circuit device of the present invention includes: a circuit board having on an upper surface thereof a built-in hybrid integrated circuit constituted by a conductive pattern and a circuit element; a case member including four side wall parts forming a frame-like shape and being in contact with the circuit board so as to form on the upper surface of the circuit board a space in which the circuit element is sealed; and a lead being fixed to a pad composed of the conductive pattern and extending to the outside. The circuit device of the present invention is further provided with a supporting part arranged at a corner of the case member so as to make continuous inner walls of the respective side wall parts with each other.

8 Claims, 8 Drawing Sheets

CIRCUIT DEVICE

This application claims priority from Japanese Patent Application Number JP 2007-249557 filed on Sep. 26, 2007, the content of which is incorporated herein by reference in its entirety.

BACKGROUND OF THE INVENTION

1. Field of the Invention

The present invention relates to a circuit device, especially to a circuit device in which a hybrid integrated circuit built on an upper surface of a circuit board is sealed by use of a case member.

2. Description of the Related Art

Figure 7:
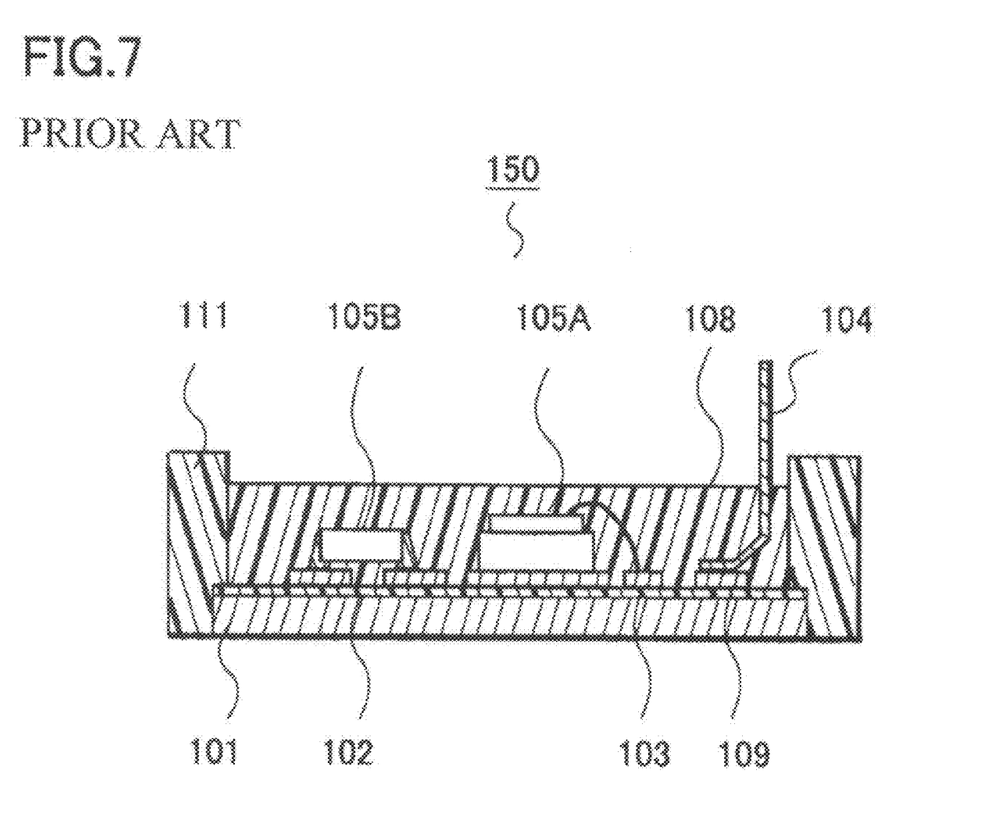
FIG. 7 is a cross-sectional view illustrating a conventional hybrid integrated circuit device.

By referring to FIG. 7, a configuration of a hybrid integrated circuit device 150 in which a case member 111 is employed will be described. Firstly, on a rectangular surface of a substrate 101, a conductive pattern 103 is formed with an insulating layer 102 in between, and a circuit element is fixed at an intended position on the conductive pattern 103 so as to form a desired electric circuit. Here, a semiconductor element 105A and a chip element 105B serving as circuit elements are connected to the conductive pattern 103. A lead 104 is connected to a pad 109 composed of the conductive pattern 103 formed in a peripheral part of the substrate 101, and functions as an external terminal. A sealing resin 108 has a function of sealing the electric circuit formed on the surface of the substrate 101.

The case member 111 has a substantially frame-like shape, and is in contact with side surfaces of the substrate 101. Furthermore, in order to secure a space for sealing on the upper part of the substrate 101, an upper end part of the case member 111 is located above the upper surface of the substrate 101. Then, a space above the substrate 101 and surrounded by the case member 111 is filled with the sealing resin 108. Thus, circuit elements, such as a semiconductor element, are sealed by the sealing resin 108. In such a configuration, even if the substrate 101 is relatively large, it is possible to seal circuit elements incorporated on the supper surface of the substrate 101 in resin sealing by filling the sealing resin 108 into the space surrounded by the case member 111 and the like.

This technology is described for instance in Japanese Patent Application Publication No. 2007-036014.

Figure 8A:
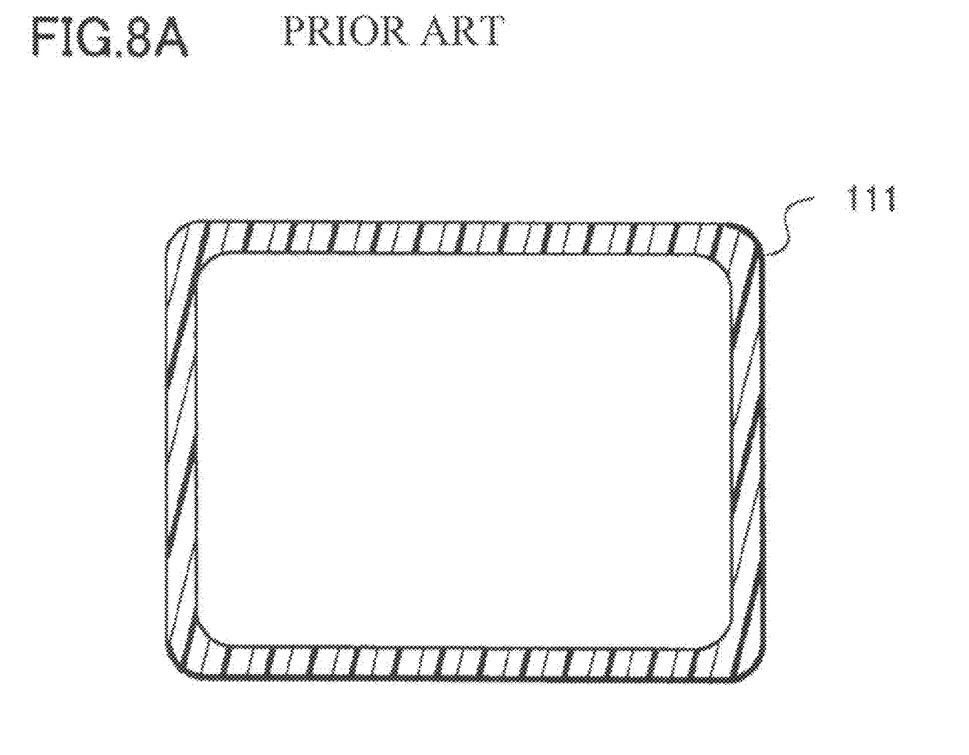
FIG. 8A and FIG. 8B are plan views.

However, the above-described hybrid integrated circuit device 150 has a problem that warpage occurs in the case member 111. To be more specific, referring to FIG. 8A, the case member 111 used for resin sealing is required to have a substantially frame-like shape when viewed from above.

Figure 8B:
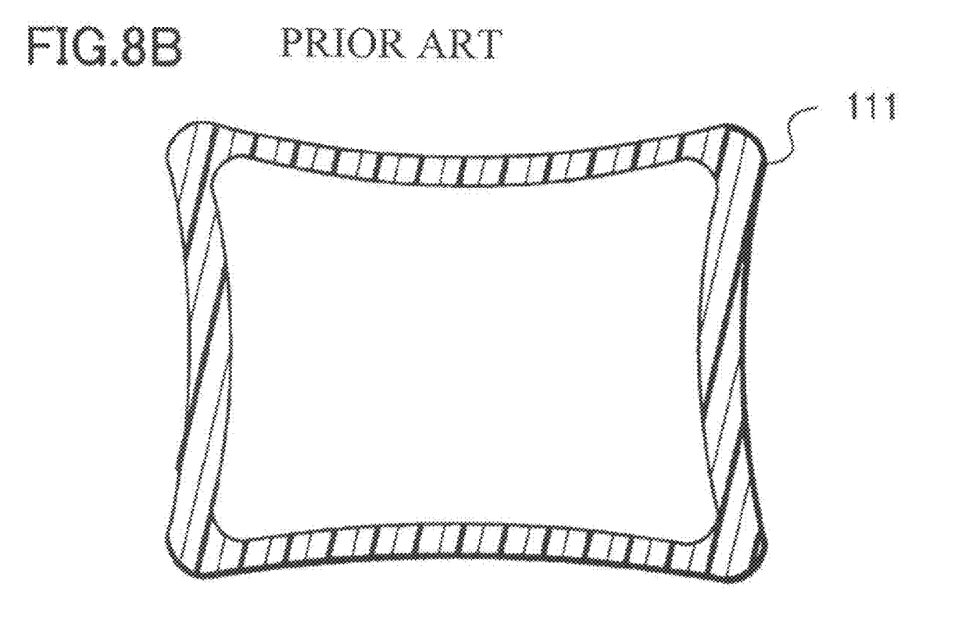

However, each side wall part of the case member 111 formed by injection molding of a thermoplastic resin or the like warps inwardly (refer to FIG. 8B). If the side wall parts of the case member 111 are deformed and warp inwardly in such a manner, this phenomenon makes it difficult to seal the upper surface of the substrate by use of the case member 111.

As for the occurrence of warpage in the case member 111 as described above, the following reasons are conceivable. Specifically, such conceivable reasons include: that the thickness of the case member 11 is uneven; that the temperature of a mold for injection molding of the case member 111 is uneven; that pressure inside of the mold cavity is uneven; that a filler and the like contained in a resin constituting the case member 111 is anisotropic; and the like.

SUMMARY OF THE INVENTION

The present invention has been made in view of the above-described problems. A main object of the present invention is to provide a circuit device in which-warpage of a case member is prevented.

A circuit device of the present invention is characterized by including: a circuit board having on an upper surface thereof a built-in hybrid integrated circuit constituted by a conductive pattern and a circuit element; a case member having four side wall parts forming a frame-like shape and being in contact with the circuit board so as to form on the upper surface of the circuit board a space in which the circuit element is sealed; and a lead being fixed to a pad composed of the conductive pattern and extending to the outside, and characterized in that a supporting part is arranged at a corner of the case member so as to make continuous inner walls of the respective side wall parts with each other.

BRIEF DESCRIPTION OF THE DRAWINGS

FIGS. 1A, 1B, and 1C are drawings illustrating a circuit device according to a preferred embodiment of the present invention.

FIGS. 2A, 2B, and 2C are drawings illustrating the circuit device according to the preferred embodiment of the present invention.

FIGS. 4A, 4B, and 4C are drawings illustrating the method of manufacturing a circuit device according to the preferred embodiment of the present invention.

FIGS. 5A and 5B are drawings illustrating the method of manufacturing a circuit device according to the preferred embodiment of the present invention.

FIGS. 8A and 8B are a drawing illustrating the conventional hybrid integrated circuit device.

DESCRIPTION OF THE INVENTION

Figure 1A:
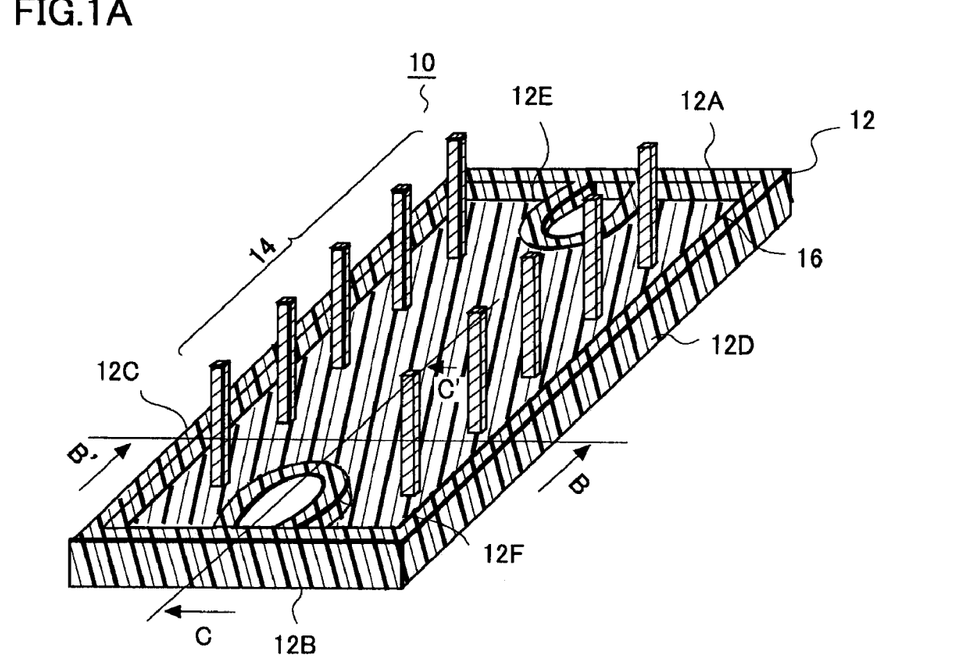
FIG. 1A is a diagonal view.
Figure 1B:
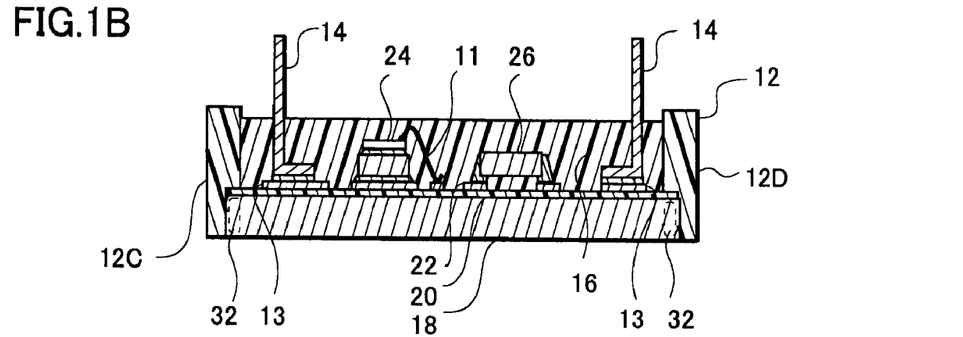
FIG. 1B is a cross-sectional view.

By referring to FIGS. 1A, 1B, and 1C, the structure of a hybrid integrated circuit device 10 as an example of a circuit device will be described. FIG. 1A is a diagonal view of the hybrid integrated circuit device 10 viewed from obliquely above. FIG. 1B is a cross-sectional view of FIG. 1A taken along the line B-B', and FIG. 1C is a cross-sectional view of FIG. 1A taken along the line C-C'.

Figure 1C:
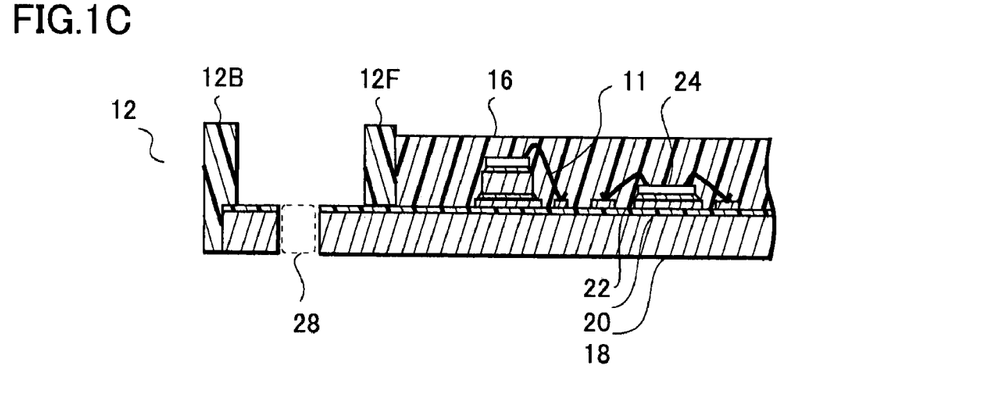
FIG. 1C is a cross-sectional view therefor.

Referring to each of FIGS. 1A, 1B, and 1C, the hybrid integrated circuit device 10 has a configuration including: a circuit board 18 having on an upper surface thereof a built-in hybrid integrated circuit constituted by a conductive pattern 22, a semiconductor element 24, and the like (circuit elements); a case member 12 having a frame-like shape and being in contact with the circuit board 18 so as to form a region in which the hybrid integrated circuit is sealed; a sealing resin 16 filling a region surrounded by the case member 12 so as to seal the hybrid integrated circuit; and a lead 14 extending to the outside while fixed to a pad 13 composed of the conductive pattern 22.

In the present embodiment, on the upper surface of the circuit board 18, the hybrid integrated circuit being composed of the conductive pattern 22 and the circuit elements and having a predetermined function is formed. To be more specific, firstly, the quadrangular (here, rectangular) upper surface of the circuit board 18 is coated by an insulating layer 20. Circuit elements, such as the semiconductor element 24 and a chip element 26, are electrically connected to predetermined positions on the conductive pattern 22 formed on the upper surface of the insulating layer 20. Furthermore, the conductive pattern 22 and the circuit elements both formed on the upper surface of the circuit board 18 are coated by the sealing resin 16. Here, the lead 14 is electrically connected to the hybrid integrated circuit built in the device and leads to the outside from the sealing resin 16 so as to function as an input and output terminal.

The circuit board 18 is a metal substrate mainly made of aluminum (Al), cupper (Cu), or the like. The actual size of the circuit board 18 is, for example, approximately 61 mm in length by 88 mm in width. Meanwhile, the thickness of the circuit board 18 is, for example, approximately 1.5 mm or 2.0 mm. In the case where a substrate made of aluminum is employed as the circuit board 18, both main surfaces of the circuit board 18 are coated by an anodic oxide film. Here, the circuit board 18 may be made of a resin material or an insulating material, such as inorganic materials represented by ceramic.

The insulating layer 20 is formed so as to cover the entire upper surface of the circuit board 18. The insulating layer 20 is made of an epoxy resin or the like in which a filler, such as $Al_2O_3$, is highly filled, for example, approximately in a range from 60% by weight to 80% by weight. By mixing such a filler, thermal resistance of the insulating layer 20 is reduced. Accordingly, heat generated from the built-in circuit element can be released well to the outside via the insulating layer 20 and the circuit board 18. The actual thickness of the insulating layer 20 is, for example, approximately 50 μm. Here, in FIG. 1B, only the upper surface of the circuit board 18 is coated by the insulating layer 20. However, the lower surface of the circuit board 18 may also be coated by the insulating layer 20. By having such a configuration, even if the reverse surface of the circuit board 18 is exposed to the outside, the reverse surface of the circuit board 18 can be insulated from the outside.

The conductive pattern 22 is made of metal, such as cupper, and is formed on a surface of the insulating layer 20 so as to form a predetermined electric circuit. Meanwhile, the pad 13 composed of the conductive pattern 22 is provided at a part to which the lead 14 is fixed. Furthermore, multiple pads are also formed around the semiconductor element 24, and the respective pads and the semiconductor element 24 are connected with each other via a thin metallic wire 11. Here, the conductive pattern 22 having a single layer is illustrated; however, a conductive pattern 22 having stacked multiple layers may be formed on the upper surface of the circuit board 18 via the insulating layer 20.

The conductive pattern 22 is formed by patterning a thin conductive film, having a thickness of approximately in a range from 50 μm to 100 μm, on the upper surface of the insulating layer 20. Accordingly, the width of the conductive pattern 22 can be formed to be as narrow as approximately in a range from 50 μm to 100 μm. In addition, the distance between parts of the conductive pattern 22 from each other can also be as narrow as approximately in a range from 50 μm to 100 μm. Therefore, even if the semiconductor element 24 is an element having several hundred electrodes, it is possible to form pads around the semiconductor device 24 according to the number of the electrodes. Furthermore, with the finely-formed conductive pattern 22, a complicated electric circuit can be formed on the upper surface of the circuit board 18.

As the circuit element electrically connected to the conductive pattern 22, an active element or a passive element can be generally employed. To be more specific, a transistor, an LSI chip, a diode, a chip resistor, a chip capacitor, an inductor, a thermistor, an antenna, an oscillator, or the like can be employed as the circuit element. Furthermore, a resin sealing-type package and the like can also be fixed to the conductive pattern 22 as a circuit element. Referring to FIG. 1B, on the upper surface of the circuit board 18, the semiconductor element 24 and the chip element 26 serving as circuit elements are arranged. Here, in the case of employing a power element having a large heat value as the semiconductor element 24, the semiconductor element 24 may be mounted on an upper surface of a heat sink made of a metal piece fixed to the upper surface of the conductive pattern 22. By having such a configuration, heat generated from the semiconductor element 24 can be efficiently released to the outside via the heat sink and the circuit board 18.

The sealing resin 16 has a function of sealing the hybrid integrated circuit built on the circuit board 18. To be more specific, the sealing resin 16 is formed on the upper surface of the circuit board 18 so as to seal the conductive pattern 22 formed on the upper surface of the circuit board 18, circuit elements, such as the semiconductor element 24, the lead 14, and a joint site of the lead 14. As a material for the sealing resin 16, a thermocuring resin or a thermoplastic resin can be employed. Furthermore, as for the sealing resin 16, for the purpose of improving the thermal conductivity and the like, a filler, such as oxidized silicon or the like, may be mixed, for example, approximately in a range from 10% by weight to 20% by weight.

The leads 14 are provided along opposing sides of the circuit board 18, and function as an input and output terminal of the hybrid integrated circuit device 10. These leads 14 are made of metal composed mostly of cupper (Cu), aluminum (Al), a Fe—Ni alloy, or the like. In the drawing, the individual leads 14 are led upwardly; however, the leads 14 may be bent at a right angle in the middle and led laterally.

Referring to FIG. 1A, the case member 12 having a frame-like shape has four side wall parts in response to four sides of the circuit board 18. To be more specific, the case member 12 is mainly composed of a first side wall part 12A, a second side wall part 12B, a third side wall part 12C, and a fourth side wall part 12D. As for the positions of the respective side wall parts on the sheet, the first side wall part 12A is located at the back, the second side wall part 12B is located in the front, the third side wall part 12C is located to the left, and the fourth side wall part 12D is located to the right. Furthermore, an inner side wall part 12F is formed continuously in the inside of the case member 12 from the second side wall part 12B. Meanwhile, an inner side wall part 12E is formed continuously in the inside from the first side wall part 12A. Further detail of the case member 12 will be described below by referring to FIGS. 2A, 2B, and 2C.

Here, the size of the case member 12 is set so that the inner walls of the respective side wall parts are in contact with the side surface of the circuit board 18. Referring to FIG. 1B, the bottom ends of the respective side wall parts (the third side wall part 12C and the fourth side wall part 12D) are engraved on the inside of the case member 12 at a depth similar to the thickness of the circuit board 18 so as to form an uneven region 32. Therefore, when the case member 12 and the circuit board 18 are fit to each other, the lower surface of the case member 12 and the lower surface of the circuit board 18 are located on the same plane. Here, the case member 12 is formed by injection molding of a resin material, such as an epoxy resin.

Furthermore, the top ends of the respective side wall parts of the case member 12 are located above the upper surface of the circuit board 18. Accordingly, when the sealing resin 16 in a liquid form or a semi-solid form is applied to the upper surface of the circuit board 18, the individual side wall parts act as a dam and prevent the applied sealing resin 16 from flowing to the outside.

By referring to FIG. 1C, the configuration of an inner side wall part 12F provided in the case member 12 will be described. Extending integrally with and continuously from the second side wall part 12B in the inside of the case member 12, the inner side wall part 12F is formed so as to surround one region of the upper surface of the circuit board 18. Here, the inner side wall part 12F extends so as to surround a region in which a through-hole 28 penetrating the circuit board 18 is formed. Furthermore, the bottom end of the inner side wall part 12F is attached to the upper surface of the circuit board 18 (the upper surface of the insulating layer 20). Therefore, even when the sealing resin 16 is applied to other region surrounded by the case member 12, the sealing resin 16 does not go into the region surrounded by the inner side wall part 12F. The region surrounded by the inner side wall part 12F is used as a region for fixing the hybrid integrated circuit device 10 by use of a fixing means, such as a screw. Therefore, an upper surface of the circuit board 18 corresponding to this region is exposed without being coated by the sealing resin 16. Such a configuration is similar to that of the inner side wall part 12E illustrated in FIG. 1A.

Figure 2A:
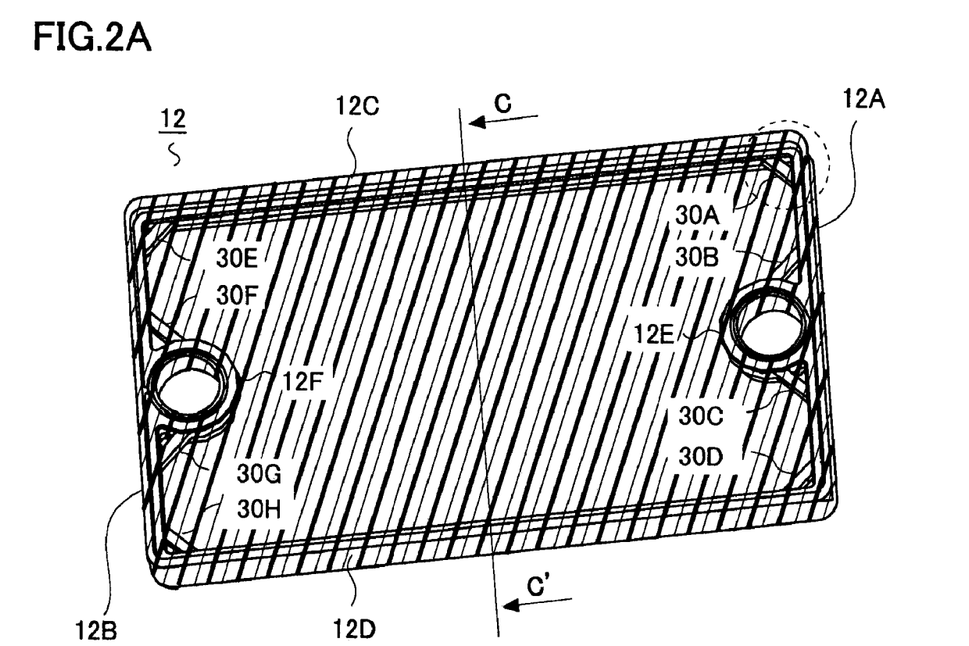
FIG. 2A is a diagonal view.
Figure 2B:
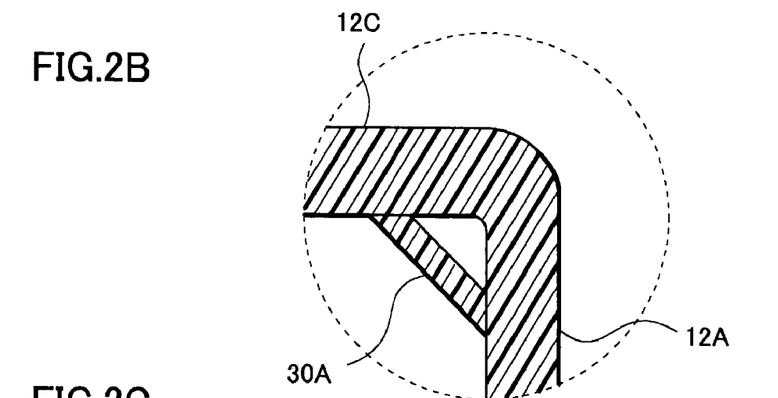
FIG. 2B is a plan view.
Figure 2C:
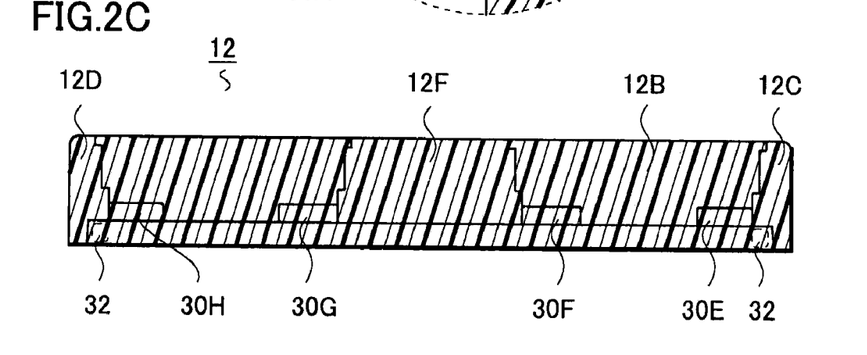
FIG. 2C is a cross-sectional view therefor.

By referring to FIGS. 2A, 2B, and 2C, a configuration of the case member 12 used in the above-described hybrid integrated circuit device 10 will be described. FIG. 2A is a diagonal view of the case member 12 viewed from below, FIG. 2B is a partial plan view of the case member 12, and FIG. 2C is a cross-sectional view of FIG. 2A taken along the line C-C'.

Referring to FIG. 2A, the case member 12 has a substantially frame-like shape, and, to be more specific, has mainly the first side wall part 12A, the second side wall part 12B, the third side wall part 12C, and the fourth side wall part 12D. Furthermore, the inner side wall part 12E is provided on the inside of the case member 12 continuously from the first side wall part 12A, and the inner side wall part 12F is provided on the inside as well continuously from the second side wall part 12B.

Additionally, in the present embodiment, a supporting part is provided at a site in which the respective side wall parts are formed continuously at a right angle. To be more specific, at a corner in which the first side wall part 12A and the third side wall part 12C are continuous with each other, a rod-like supporting part 30A is provided which is formed integrally with and continuously from the inner walls of the first side wall part 12A and the third side wall part 12C. In a similar configuration, a supporting part 30D is formed at a corner in which the first side wall part 12A and the fourth side wall part 12D are continuous with each other. Furthermore, a supporting part 30H is provided at a corner in which the fourth side wall part 12D and the second side wall part 12B are continuous with each other, and a supporting part 30E is formed at a corner in which the second side wall part 12B and the third side wall part 12C are continuous with each other. Here, the supporting part 30A and the like are sometimes referred to as "ribs" because they reinforce the individual side wall parts.

Furthermore, in the present embodiment, supporting parts are also provided between the inner side wall parts 12E and 12F formed in the inner region of the case member 12 and the corresponding side wall parts. To be more specific, supporting parts 30B and 30C are provided between the first side wall part 12A and the inner side wall part 12E. Furthermore, supporting parts 30F and 30G are provided between the second side wall part 12B and the inner side wall part 12F.

By referring to FIG. 2B, a configuration of the supporting part 30A provided between the third side wall part 12C and the first side wall part 12A. The supporting part 30A is formed so as to make continuous the inner wall of the third side wall part 12C and the inner wall of the first side wall part 12A, which are continuous with each other at a right angle at a corner of the case member, with each other. A cross-sectional area of the supporting part 30A is formed to be smaller than the side wall parts constituting the case member 12. For example, in the case where the cross section of the first side wall part 12A is 7 mm in length by 4 mm in width, the cross section of the supporting part 30A is approximately 1 mm in length by 1.5 mm in width. Such a shape is similar to those of the other supporting parts 30B and the like.

Referring to FIG. 2C, the uneven region 32 is formed by hollowing the inner side of the bottom ends of the respective side wall parts. Here, by hollowing upward the inner part of the bottom ends of the fourth side wall part 12D and the third side wall part 12C, the uneven region 32 is formed. The uneven region 32 is a region in which the circuit board 18 illustrated in FIG. 1 is housed, and the thickness thereof may be equal to that of the circuit board 18. Meanwhile, the uneven region 32 is formed in a similar manner in the first side wall part 12A and the second side wall part 12B.

Furthermore, lower surfaces of the respective supporting parts 30H, 30G, 30F, and 30E are located in the same plane as the upper surfaces of the uneven regions 32 formed in the third side wall part 12C and the fourth side wall part 12D. This configuration also applies to the supporting parts 30A and the like. Meanwhile, the lower surface of the inner side wall part 12F is also located in the same plane as the upper surface of the uneven region 32.

In the present embodiment, supporting parts 30A and the like which make the side wall parts of the case member 12 continuous with each other at corners are provided in order to avoid the problem of the related art that side walls of a case member warp inwardly. To be more specific, referring to FIG. 2B, at the corner of the case member 12, the inner wall of the third side wall part 12C and the inner wall of the first side wall part 12A are connected by the rod-like supporting part 30A. Since the case member 12 is made of a thermoplastic resin, when the case member 12 is molded by injection, shrinkage occurs to the case member 12 after the molding. Therefore, without taking measures against the shrinkage after the molding, there is a possibility that the case member 12 has the side wall parts thereof warping inwardly as in the case member 111 illustrated in FIG. 8B. In the present embodiment, in order to prevent the inward warpage of the side wall parts of the case member 12, the supporting parts 30A and the like having the above-described configuration are provided at the respective corners of the case member 12. By providing the supporting part 30A, even if stress is applied to the third side wall part 12C and the first side wall part 12A illustrated in FIG. 2B so as to warp them inwardly, the third side wall part 12C and the first side wall part 12A are supported outwardly by the supporting part 30A. Therefore, it can be prevented that the third side wall part 12C and the first side wall part 12A are warped inwardly due to shrinkage of the resin constituting the case member 12. This is also applicable to other side wall parts (the second side wall part 12B and the third side wall part 12C).

In addition to the formation of the above-described supporting part 30A, in the present embodiment, the sizes of the cross sections of the respective side wall parts (the first side wall part 12A, the second side wall part 12B, the third side wall part 12C, and the fourth side wall part 12D) are made uniform. By doing so, even if a force is applied to the side wall parts so as to warp them inwardly during shrinkage after molding, a straining effect by the supporting parts 30A and the like occurs. Accordingly, warpage deformation of the case member 12 can be prevented.

Furthermore, in the present embodiment, the above-described supporting parts 30A and the like are provided at the respective corners of the case member 12. To be more specific, when the effect of the supporting parts 30A and the like to prevent warpage of the side wall parts is taken into consideration, for example, referring to FIG. 2A, it is also possible to form a supporting part extending from the middle part of the third side wall part 12C to the middle part of the fourth side wall part 12D. However, if a supporting part having such a shape is formed, the positions of the circuit elements, such as the semiconductor element 24, and the conductive pattern 22, which are illustrated in FIG. 1B, are limited by the supporting part. On the other hand, the supporting parts 30A and the like of the present embodiment illustrated in FIG. 2A are provided at the respective corners, in which no conductive pattern and circuit elements are provided, of the case member 12. Therefore, by having the supporting parts 30A and the like of the present embodiment, the possibility that the shape of the conductive pattern 22 formed on the upper surface of the circuit board 18 and the positions of the circuit elements are limited is reduced.

Moreover, the cross-sectional areas of the supporting parts 30A and the like are formed to be smaller than the cross-sectional areas of the respective side wall parts constituting the case member 12. In order to simply prevent deformation of the case member 12, for example, referring to FIG. 2B, it is also possible to constitute the supporting part 30A which is integral with the third side wall part 12C and the first side wall part 12A. However, if such a configuration is used, the side wall part at the corner of the case member 12 ends up being thicker than other parts. Accordingly, in the forming process of the case member 12, there is a possibility that sink occurs in this side wall part. In order to avoid this problem, in the present embodiment, the supporting part 30A has a rod-like shape thinner than the first side wall part 12A and the like. Accordingly, the individual four side wall parts constituting the case member 12 (the first side wall part 12A, the second side wall part 12B, the third side wall part 12C, and the fourth side wall part 12D) have a uniform thickness throughout the parts including those at the corners in which the side wall parts are continuous with each other. Therefore, the above-described sink is prevented.

Furthermore, referring to FIG. 2C, the lower surfaces of the supporting parts 30H, 30G, 30F, and 30E are located substantially in the same plane as the lower surface of the uneven region 32. By having such a configuration, attachment strength between the case member 12 and the circuit board 18 is improved. To be more specific, the case member 12 and the circuit board 18 (refer to FIG. 1B) are attached via an adhesive made of a resin. Then, by applying the adhesive to the lower surfaces of the supporting parts 30H, 30G, 30F, and 30E as well as the uneven region 32, these parts can be attached to the upper surface of the circuit board 18. As a result, attachment strength between the circuit board 18 and the case member 12 is improved, and detachment of the case member 12 from the circuit board 18 can be prevented.

Next, by referring to FIG. 3 to FIG. 6, a method of manufacturing the above-described hybrid integrated circuit device will be described.

Figure 3:
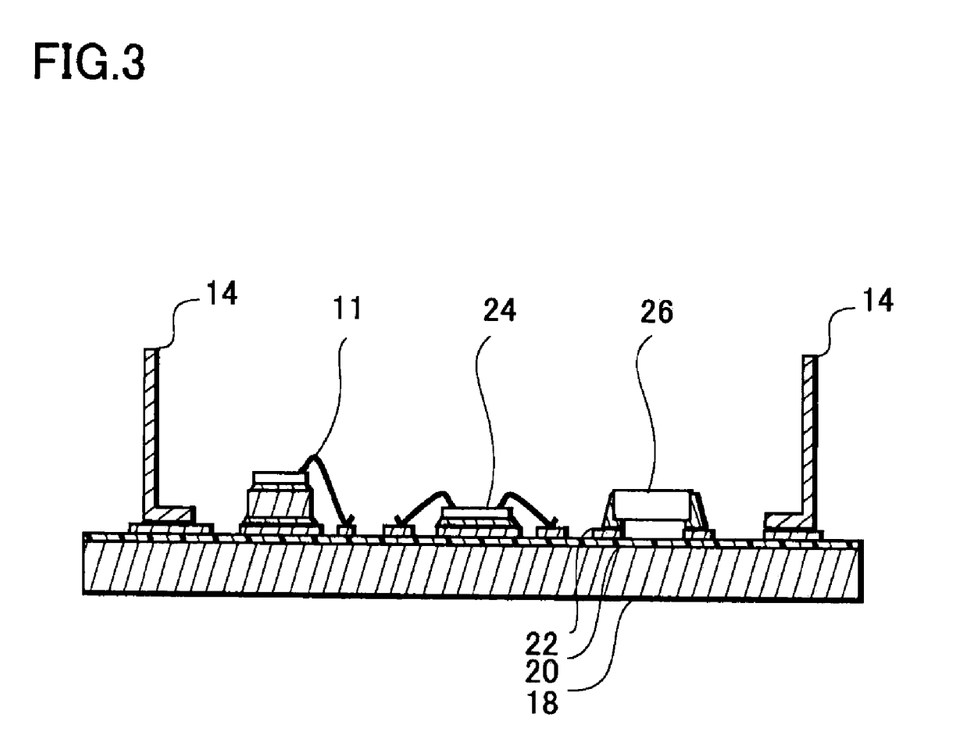
FIG. 3 is a cross-sectional view illustrating a method of manufacturing a circuit device according to a preferred embodiment of the present invention.

Referring to FIG. 3, firstly, a hybrid integrated circuit composed of a conductive pattern 22 and circuit elements is formed on the upper surface of a circuit board 18. The circuit board 18 is formed by separating a large-sized metal substrate mainly made of metal, such as aluminum, as described above into a quadrangle shape piece having a predetermined size. As a method of separating a metal substrate to form the circuit board 18, a punching process using a punching mold, a dicing process, a bending process, and the like are adoptable. Meanwhile, as for the circuit board 18, a substrate made of a resin and an insulating substrate made of an inorganic material, such as ceramic, can also be employed.

Here, a substrate made of metal is employed as the circuit board 18. The upper surface of the circuit board 18 is coated by an insulating layer 20 composed mainly of a resin, and a conductive pattern 22 having a predetermined shape is formed on the upper surface of this insulating layer 20. The formation of the conductive pattern 22 can be achieved by patterning a conductive foil composed of cupper or the like having a predetermined thickness in a selective etching process.

At predetermined sites of the conductive pattern 22, the circuit elements composed of a semiconductor element 24 and a chip element 26 are fixed. The semiconductor element 24 is fixed at a reverse side thereof to the upper surface of the conductive pattern 22 having a land-like shape via a conductive or insulating adhesive, and an electrode located on the upper surface of the semiconductor element 24 is connected to the conductive pattern 22 having a pad-like shape via a thin metallic wire 11. Furthermore, electrodes located on both sides of the chip element 26 are fixed to the conductive pattern 22 having a pad-like shape via a conductive adhesive, such as solder. Furthermore, on the upper surface of a pad composed of the conductive pattern 22, a lead 14 is fixed thereto. Here, the fixing of the lead 14 may be carried out after the completion of attachment between a case member 12 and the circuit board 18, which will be described below.

The above-described fixing of the circuit elements and the lead is carried out by applying a solder cream to the conductive pattern 22 at a predetermined position, mounting various parts on the upper surface of the solder cream, and then melting the solder cream. Such a mounting method is called a reflow process.

Figure 4A:
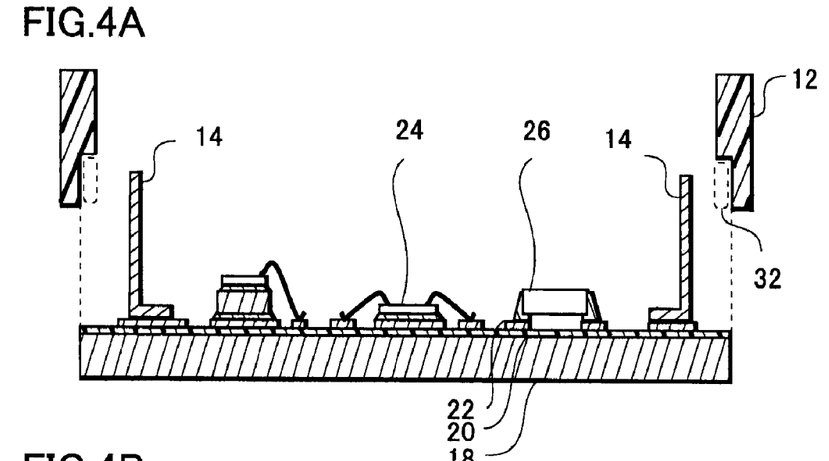
FIG. 4A is a cross-sectional view.
Figure 4B:
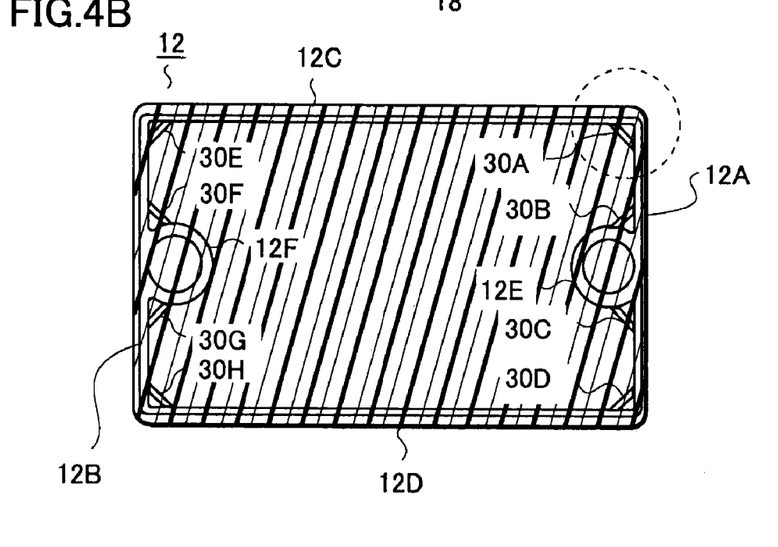
FIG. 4B is a plan view.
Figure 4C:
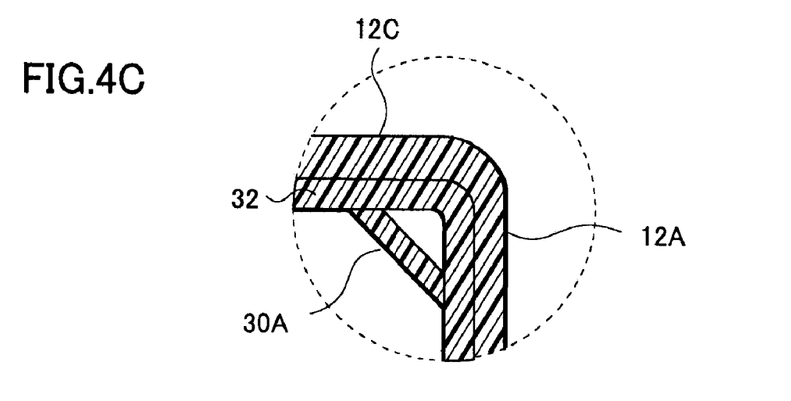
FIG. 4C is a plan view therefor.

Referring to FIGS. 4A, 4B, and 4C, next, the case member 12 is attached to a circuit board 18. FIG. 4A is a cross-sectional view illustrating the present process, FIG. 4B is a plan view illustrating the case member 12, and FIG. 4C is a plan view illustrating an enlarged part of the case member 12.

Referring to FIG. 4A, in the present process, the case member 12 which has been coated with an adhesive at a predetermined site is attached to the circuit board 18 by fitting the case member 12 to the circuit board 18 from above. At the bottom end of a side wall part of the case member 12, an uneven region 32 in which the inner part of the side wall part is hollowed is provided. The side surface and bottom surface of the uneven region 32 come in contact with the side surface and upper surface of the circuit board 18, respectively.

In FIG. 4B and FIG. 4C, a plan view of the above-described case member 12 viewed from below is illustrated. The configuration of the case member 12 is as described by referring to FIGS. 2A, 2B, and 2C. In the drawings of FIG. 4B and FIG. 4C, a part to which an adhesive is applied is shown by dot hatching. Firstly, the adhesive is applied to the uneven region 32 formed on the inner sides of a first side wall part 12A, a second side wall part 12B, a third side wall part 12C, and a fourth side wall part 12D. Furthermore, the adhesive is also applied to the reverse surfaces of supporting parts 30A to 30H and inner side wall parts 12E and 12F. Then, the reverse surfaces of these respective parts are fixed to the upper surface of the circuit board 18 via the adhesive. Here, as for an adhesive to be used, both a thermocuring resin, such as an epoxy resin, and a thermoplastic resin, such as an acrylic resin, may be used. In the case where a thermocuring resin is employed as the adhesive, the adhesive is heated for curing after the above-described fitting is carried out.

Figure 5A:
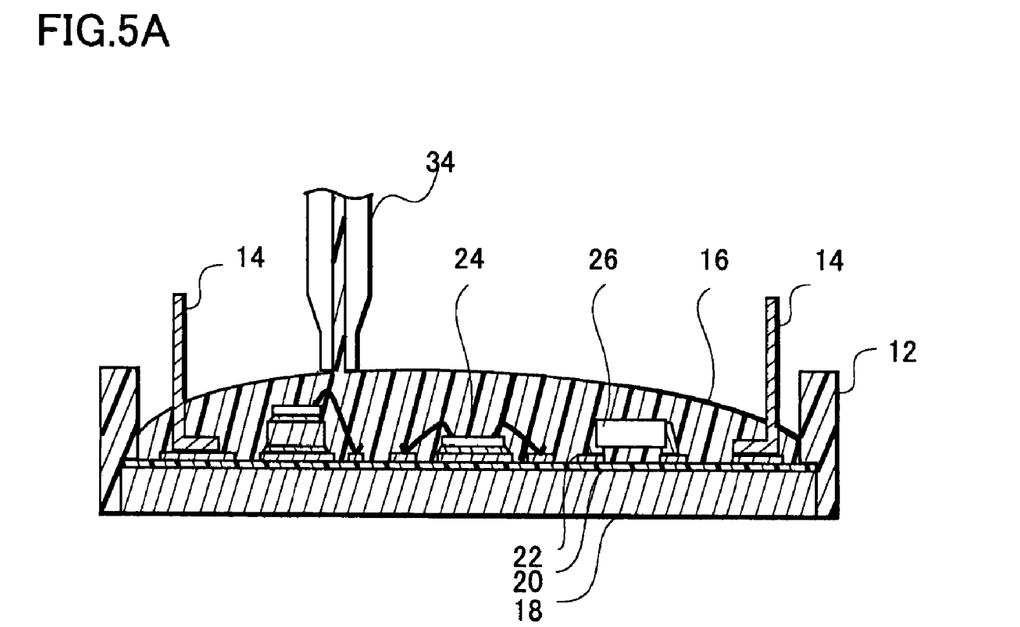
FIG. 5A is a cross-sectional view.
Figure 5B:
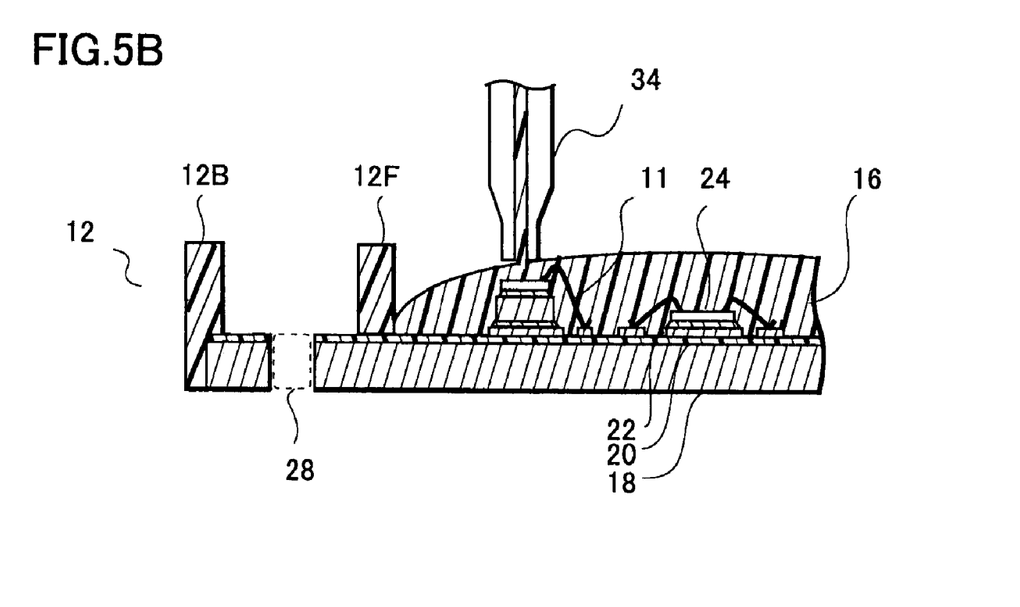
FIG. 5B is a cross-sectional view therefor.

Referring to FIGS. 5A and 5B, next, the conductive pattern 22 and the circuit elements are sealed by filling a sealing resin 16 into a space surrounded by the case member 12.

Referring to FIG. 5A, in the present process, after a nozzle 34 is moved to the upper side of the circuit board 18, the sealing resin 16 is supplied from the tip of the nozzle 34 onto the upper surface of the circuit board 18 surrounded by the case member 12. The sealing resin 16 is made of a resin material in which a filler composed of silica, alumina, or the like is mixed. Here, as a resin material constituting the sealing resin 16, any one of a thermocuring resin and a thermoplastic resin is appropriate. Moreover, in the case where a thermocuring resin is employed as the sealing resin 16, a process for curing the sealing resin 16 by heating is required.

Referring to FIG. 5B, in the present process, the sealing resin 16 is not filled to a region surrounded by the inner side wall part 12F. The region surrounded by the inner side wall part 12F is a region to which the circuit board 18 is to be fixed by a screw in a later process; therefore, the upper surface of the circuit board 18 needs to be exposed without being coated by the sealing resin 16. Referring to FIG. 1A, in the same way, a region surrounded by the inner side wall part 12E is not filled with the sealing resin 16, either.

By carrying out the above-described processes, the hybrid integrated circuit device 10 illustrated in FIG. 1 is manufactured.

Figure 6:
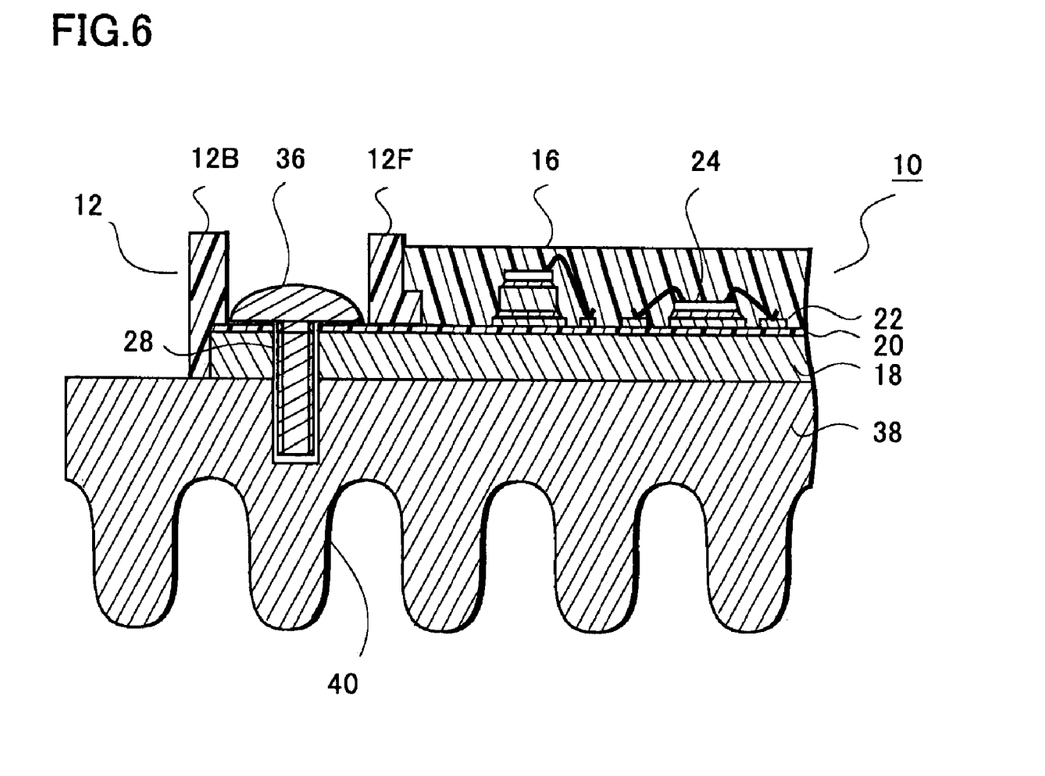
FIG. 6 is a cross-sectional view illustrating the method of manufacturing a circuit device according to the preferred embodiment of the present invention.

By referring to the cross-sectional view in FIG. 6, a configuration in which a hybrid integrated circuit device 10 is attached to a heat sink 38 will be described.

In the hybrid integrated circuit device 10 of the present embodiment, a power transistor for high current switching application is employed as a semiconductor element 24. Therefore, in order to release a large amount of heat generated from the semiconductor element 24 to the outside well, the lower surface of a circuit board 18 of the hybrid integrated circuit device 10 is brought into contact with the heat sink 38. The heat sink 38 is made of a metal, such as cupper and aluminum, having excellent heat releasing property, and has a function of releasing heat conducted through the circuit board 18 to the outside efficiently.

For attachment of the hybrid integrated circuit device 10 to the heat sink 38, a method by screw fixing by use of a screw 36 is adopted. In an actual attaching method, firstly, the hybrid integrated circuit device 10 is mounted on a smooth upper surface of the heat sink 38, and then the position of a through-hole 28 on the circuit board 18 and the position of a hole part 40 on the heat sink 38 are aligned. Next, the hybrid integrated circuit device 10 is mounted on the heat sink 38 by inserting the screw 36 to the through-hole 28 and the hole part 40 and then tightening the screw 36 to attach the reverse surface of the circuit board 18 to the upper surface of the heat sink 38 firmly. Similarly, referring to FIG. 1A, fixing of the circuit board 18 by use of the screw 36 is also carried out inside of an inner side wall part 12E.

Here, the hybrid integrated circuit device 10 before being mounted on the heat sink 38 is globally curved to have a slightly convex shape towards a lower direction. To be more specific, the circuit board 18, a sealing resin 16, and a case member 12 which constitute the hybrid integrated circuit device 10 are curved to have a slightly convex shape towards a lower direction. The reason for the hybrid integrated circuit device 10 being curved in such a manner is that the sealing resin 16 coating the whole upper surface of the circuit board 18 shrinks upon curing.

In the meantime, the upper surface of the heat sink 38 is a flat surface. Therefore, when the reverse surface of the circuit board 18 is attached to the upper surface of the heat sink 38 by the pressing force of the screw 36, the shape of the circuit board 18 is corrected to be flat. On the other hand, no pressing force of the screw 36 is applied to other parts (especially the case member 12) of the hybrid integrated circuit device 10. Therefore, a force for detaching the case member 12, which maintains the convex shape towards the lower direction, from the circuit board 18, which shape is corrected to be flat, acts therebetween.

In the present embodiment, in order to prevent the case member 12 from detaching from the circuit board 18, the area in which the case member 12 and the circuit board 18 are attached firmly to each other is made large. To be more specific, referring to FIG. 4B and FIG. 4C, on the reverse surface of the case member 12, an adhesive is applied to the reverse surface of supporting parts 30A and the like and the reverse surfaces of inner side wall parts 12E and 12F as well as an uneven region 32 of each side wall part so as to attach the reverse surface of the case member 12 firmly to the upper surface of the circuit board 18. Therefore, the attachment strength between the case member 12 and the circuit board 18 is extremely strong. As a result, in the process of attaching the hybrid integrated circuit device 10 to the heat sink 38, even if a force for detaching the case member 12 from the circuit board 18 is applied, the detachment therebetween is prevented.

According to the present invention, a supporting part is arranged at each corner of a case member so as to make continuous side wall parts constituting the case member with each other. Therefore, even if stress is applied to the side wall parts of the case member so as to warp them inwardly, inward deformation of the side wall parts is prevented because the side wall parts are supported by the supporting part.

Furthermore, in the present invention, an uneven region is formed at the side wall part of the case member so as to bring the case member in contact with a circuit board, and a main surface of the supporting part is located in the same plane as the uneven region. By having such a configuration, when the case member is attached to the circuit board, it is possible to use the supporting part as well as the uneven region as a region for the attachment. Accordingly, the area in which the case member and the circuit board are attached firmly with each other is increased; therefore, the strength of the attachment between the case member and the circuit board can be increased.

What is claimed is:
1. A circuit device, comprising:
a circuit board having on an upper surface thereof a built-in hybrid integrated circuit constituted by a conductive pattern and a circuit element;
a case member including four side wall parts forming a frame-like shape and in contact with the circuit board so as to form on the upper surface of the circuit board a space in which the circuit element is sealed;

a sealing resin to coat the conductive pattern and the circuit element on the upper surface of the circuit board and to fill in the space;

a lead fixed to a pad composed of the conductive pattern and extending to the outside of the sealing resin; and a supporting part arranged at a corner of the case member so as to make continuous inner walls of the respective side wall parts with each other, wherein a lower surface of the supporting part is attached to the upper surface of the circuit board and the supporting part is covered by the sealing resin.

2. The circuit device according to claim 1, wherein an uneven region in which the circuit board is to be housed is formed by partially hollowing inner sides of the respective side wall parts, a principal surface of the supporting part is located in the same plane as the uneven region, and the case member is fixed to the circuit board via an adhesive applied to the uneven region and the supporting part.

3. The circuit device according to claim 1, wherein cross-sectional areas of the side wall parts are formed to be identical with each other, and a cross-sectional area of the supporting part is smaller than the cross-sectional area of each side wall part.

4. The circuit device according to claim 1, wherein the supporting part is provided to each of the four corners of the case member.

5. The circuit device according to claim 1, further comprising an inner side wall surrounding a region in which the circuit board is to be fixed by a screw, while continuing with the inner wall of the side wall part, wherein the inner wall of the side wall part and the inner side wall are made continuous with each other by the supporting part.

6. The circuit device according to claim 1, wherein a thickness of a lower part of the side wall part contacting a side surface of the circuit board is thinner than an upper part of the side wall.

7. The circuit device according to claim 1, wherein the lower surface of the supporting part is attached to the upper surface of the circuit board by an adhesive.

8. The circuit device according to claim 1, wherein a bottom surface of the supporting part is attached to a top surface of the circuit board.

* * * * *